United States Patent [19]

Curran

[11] Patent Number: 4,755,484
[45] Date of Patent: Jul. 5, 1988

[54] METHOD OF MAKING A SEMIMETAL SEMICONDUCTOR CONTACT

[75] Inventor: Patrick A. Curran, Plano, Tex.

[73] Assignee: Texas Instruments Incorporated, Dallas, Tex.

[21] Appl. No.: 876,322

[22] Filed: Jun. 19, 1986

[51] Int. Cl.$^4$ .................... H01L 31/06; H01L 21/324
[52] U.S. Cl. ................................ 437/106; 437/109;
437/110; 437/193; 437/196; 437/174; 437/967;
148/DIG. 169; 148/DIG. 122; 156/610;
156/612; 357/67; 357/71; 357/91
[58] Field of Search ............... 357/65; 29/590, 576 B,
29/589; 136/258 PC; 427/95; 437/109, 110,
193, 196; 148/DIG. 174, DIG. 967

[56] References Cited

U.S. PATENT DOCUMENTS

| | | | |
|---|---|---|---|
| 4,492,736 | 1/1985 | Tanner | 428/446 |
| 4,525,593 | 6/1985 | Yablonovitch | 136/255 |
| 4,608,096 | 8/1986 | Hill | 148/33 |

OTHER PUBLICATIONS

Seiichi MiYazaki, Yukio Osaka and Masataka Hirose, Solar Energy Materials 11, (1984), 85–95.
Timothy J. Maloney, "MBE Growth and Characterization of Single Crystal Silicon Oxides on (111) and (100) Silicon", J. Vac. Technol. B., vol. 1, No. 3, Jul.–Sep. 1983.
"An n–Sipes: p Sipos Homojunction and a Sipos–Si Sipos Double Heterostructure", E. Yablonovitch, IEEE Trans. on Elec. Dev., Oct. 1984, pp. 1146–1148.
J. Yao, A. Rastogi, N. Du, X.W.W, P. K. John, B. Y. Tong and S. K. Wong, IEEE Trans. on Elec. Dev., Apr. 1986, pp. 1116–1120.
P. H. Fang, C. C. Schubert, Peiguang Bei and J. H. Kinnier, Appl. Physics Lett. 41 (4), Aug. 15, 1982, pp. 365–366.
Bean et al., "Silicon MBE Apparatus for Uniform High-rate Deposition on Standard Format Wafers", J. Vac. Sci. Technol., 20 (2), Feb. 1983, pp. 137–142.

Primary Examiner—Brian E. Hearn
Assistant Examiner—Beverly Pawlikowski
Attorney, Agent, or Firm—Gary C. Honeycutt; Melvin Sharp; N. Rhys Merrett

[57] ABSTRACT

A semiconductor contact system controls the boundary recombination velocity and optimizes the semiconductor transport phenomena and includes a microcrystalline layer of doped semiconductor microcrystals surrounded by a semiconductor oxide. The microcrystalline layer is acceptor and oxygen doped to provide unipolar hole transport and donor and oxygen doped to provided unipolar electron transport. The oxygen doping is implanted several atomic layers into the semiconductor to form a gradient between the semiconductor and microcrystalline layer to preserve the semiconductor monocrystalline lattice. The thickness of the microcrystalline film is adjusted to be thick enough to control the effective chemostatic potential terminating the semiconductor and thin enough to enhance the series microcrystalline film resistance.

5 Claims, 1 Drawing Sheet

METHOD OF MAKING A SEMIMETAL SEMICONDUCTOR CONTACT

BACKGROUND OF THE INVENTION

1. Field of the Invention

This invention relates to improvements in contacts for making connection to semiconductor material, and, more particulary to a semiconductor contact system which provides electrical contact to a semiconductor region with control of the boundary recombination velocity to optimize semiconductor transport phenomena.

2. Description of the Prior Art

The termination and contact to a crystalline semiconductor have significant effects on the boundary recombination velocity of the semiconductor, which, in turn, significantly influences its transport phenomena. Contact to a semiconductor is usually realized by a metal to transport mobile carriers into or out of the semiconductor lattice in an exchange with an electrical ambient. Current flow can be viewed as an apparent flux of mobile carriers of one polarity traveling in one direction and an apparent flux of mobile carriers of the opposite polarity traveling in the opposite direction. With respect to an ammeter reading of the current, it is not possible to ascertain the relative flux stength of the respective mobile carriers. Although of little external importance, the relative flux weighting is of extreme importance to internal semiconductor transport phenomena.

Metals and semiconductors are different, since metals employ unipolar charge transport and semiconductors employ bipolar charge transport. Thus, in establishing a connection between a metal and a semiconductor, the metal-semiconductor interface requires a unipolar-bipolar charge conversion.

More particularly, at absolute zero a semiconductor has a filled valence band and an empty conduction band. As the temperature is increased, a number of mobile electrons are excited into the conduction band, leaving an equal number of holes in the valence band. Doping impurities introduce mobile carriers into one band, but not the other, thereby altering the effective bandgap energy.

The "chemostatic potential" of a material is a measure of its relative bipolar charge transport. For a zero chemostatic potential, the transport is purely bipolar, having equal mobile holes and electrons in their respective bands. For large chemostatic potentials, transport is effectively unipolar, a large positive chemostatic potential having primarily electron transport and a large negative chemostatic potential having primarily hole transport. One characteristic of semiconductor transport is that changes in the band-to-band recombination generation rate alter the chemostatic potential.

Metals, on the other hand, have one band completely filled, and another band partially filled, with no band-to-band mobile carrier transfer. Consequently, charge transport occurs via the partially filled band, without change in the the mobile carrier concentration. Thus, a metal acts as a "mobile carrier gas", with a constant chemostatic potential. For efficient energy exchange with a semiconductor, it is important that the metal mobile carrier gas have an energy associated with its partially filled band comparable to that of the semiconductor valence, or conduction, band. If the partially filled band of the metal is near the valence band of the semiconductor, the metal is termed a "hole-gas" metal, and if the partially filled band of the metal is near the conduction band of the semiconductor, the metal is termed an "electron-gas" metal.

SUMMARY OF THE INVENTION

In accordance with a broad aspect of the invention, a semiconductor contact system is provided in which electrical contact to a semiconductor region controls the boundary recombination velocity in order to optimize the semiconductor transport phenomena. The contact system includes a doped microcrystalline layer which is acceptor and oxygen doped, P$^-$ semimetal, to provide unipolar hole transport and donor and oxygen doped, N$^-$ semimetal, to provide unipolar electron transport. In one embodiment, the oxygen doping is implanted several atomic layers into the semiconductor region below the microcrystalline layer so that the monocrystalline lattice of the semiconductor region is not abruptly terminated, and the lattice periodicity is not disrupted. The semimetal layer is formed of doped silicon microcrystals and a surrounding silicon oxide layer. Finally, a metal layer is formed over the semimetal layer.

In accordance with another broad aspect of the invention, a method for forming a contact to a semiconductor region is presented in which oxygen is implanted several atomic layers into the semiconductor region below the microcrystalline layer so that the monocrystalline lattice of the semiconductor region is not abruptly terminated, and the lattice periodicity is not disrupted. The thickness of the semimetal layer is adjusted to be thick enough to control the effective chemostatic potential terminating the semiconductor crystal and thin enough to enhance the series resistance of the semimetal layer.

BRIEF DESCRIPTION OF THE DRAWINGS

The invention is illustrated in the accompanying drawings, in which.

DESCRIPTION OF THE PREFERRED EMBODIMENTS

Figure 1:
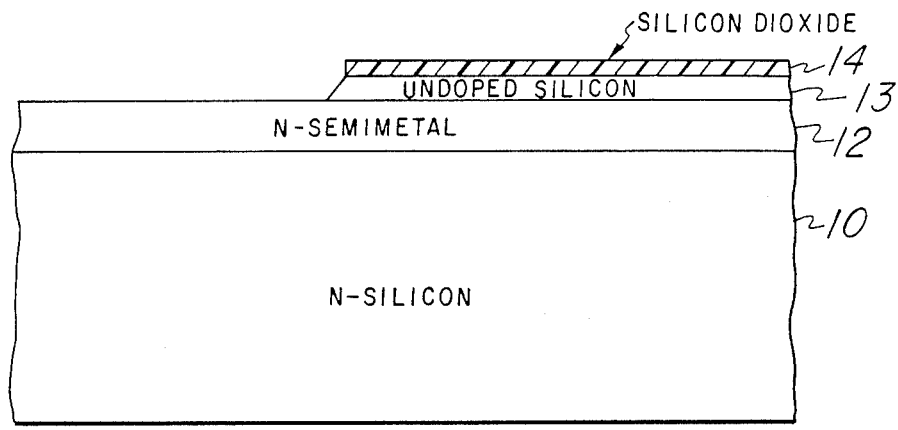
FIG. 1 is a side elevational cross-section of a semiconductor material on which a patterned isotype donor semimetal in accordance with a preferred embodiment of the invention has been formed.

It will be realized that although the present invention is described with particular respect to monocrystalline silicon, the principles of the invention apply both to other simple semiconductors, such as germanium, or the like, as well as to compound semiconductors, such as gallium arsenide, or the like. In addition, for silicon, aluminum is described as a hole-gas metal and titanium as an electron-gas metal.

Since the chemostatic potential of metal is essentially constant, the differences in the electrochemical potential between the metal and the semiconductor are manifested by chemostatic potential variation in the semiconductor. This results in the formation of a depletion layer in the semiconductor region. A minority carrier recombination velocity is established in the depletion layer reflecting the divergence between the unipolar metal and bipolar semiconductor charge transports. Pure bipolar transport, that is, an intrinsic semiconductor, results in the maximum chemostatic potential magnitude divergence and the largest isotype recombination velocity. The recombination velocity, in this case, is limited by the mobile carrier thermal velocity. For very heavily doped semiconductor regions, then quasi-unipolar transport exists. This results in a very low recombination velocity. The semiconductor region may have quasi-unipolar hole transport for heavily acceptor doped regions or quasi-unipolar electron transport for heavily donor doped regions while the metal is constrained to a characteristic unipolar transport, for example, a unipolar hole transport for aluminum. Since the metal chemostatic potential is constant, the resultant chemical modulation of the semiconductor region in the depletion layer determines the boundary recombination velocity at the edge of the depletion region in the semiconductor. This is termed the metal boundary recombination velocity. If the semiconductor chemostatic potential is nearly identical to that of the contact metal, then a chemically neutral semiconductor surface exists with a low metal boundary recombination velocity, since the semiconductor transport is practically unipolar with the same mobile carrier polarity as the metal. Hence, virtually no unipolar-bipolar charge conversion is required. A finite metal boundary recombination velocity exists due to bandgap effects in the semiconductor which are non-existent in the metal. For example, the very low metal boundary recombination velocity characteristic of a chemically neutral surface exists for aluminum contacting heavily acceptor doped silicon or titanium contacting heavily donor doped silicon.

If the semiconductor chemostatic potential is of the same polarity as the metal, but with a slightly lower magnitude, then chemical depletion of the semiconductor surface results. The resultant depletion layer causes a field to alter the minority carrier concentration from that effective value associated with the energy level of the metal (neutral metal boundary recombination velocity condition) to that value associated with the bulk semiconductor region. The semiconductor recombination rate is accordingly graded in this transition region. A recombination rate gradient results in a recombination velocity with the magnitude directly related to the gradient steepness. The resultant chemostatic field in the metal-semiconductor transition region is exactly balanced by an opposing electrostatic field. The electrostatic field forms a potential barrier that impedes a charge flux between the metal and semiconductor. For metal and semiconductor chemostatic potentials of the same polarity, the barrier is termed the isotype Schottky barrier. The isotype Schottky barrier height increases with increasing divergence in metal and semiconductor chemostatic potential magnitudes. The maximum isotype Schottky barrier height occurs for the intrinsic semiconductor.

The flux from the metal consists strictly of the unipolar metal mobile carrier gas. If there exists a non-vanishing metal boundary recombination velocity (with a resultant isotype Schottky barrier), then the metal mobile carrier flux splits from a unipolar flux in the metal to a bipolar flux in the semiconductor. The unipolar-bipolar flux conversion occurs in the metal-semiconductor depletion region. Those flux charges occupying traps in the depletion region which capture minority carrier in the depletion region due to a finite recombination velocity cause a conversion of part of the metal gas flux into a semiconductor minority carrier flux. The remaining semiconductor flux is a majority carrier flux. Since the semiconductor minority carrier and the semiconductor majority carrier fluxes are in opposite directions, with opposite polarity mobile carriers, the current components are in the same direction and always sum to the current associated with the metal gas flux.

Thus, increased chemical depletion of the semiconductor region due to the chemostatic potential magnitude divergence gives rise to a boundary recombination velocity, with a resultant isotype Schottky barrier which separates the metal flux into a semiconductor minority carrier flux and a semiconductor majority carrier flux traveling in opposite directions. The ratio of the semiconductor minority carrier flux associated with the metal boundary recombination velocity to the total metal unipolar flux is termed the metal minority carrier injection ratio. For a chemically neutral semiconductor surface with respect to the contact metal, the metal boundary recombination velocity, isotype Schottky barrier height, and metal minority carrier injection ratio are all very low. The chemically neutral condition requires virtually no unipolar-bipolar flux conversion. As the semiconductor region approaches the intrinsic case, the metal boundary recombination velocity and the metal minority carrier injection ratio both increase. For the intrinsic case, the metal minority carrier injection ratio is a half, which requires equal splitting of the metal gas flux into equal semiconductor minority and majority carrier fluxes.

As the semiconductor region switches polarity in the chemostatic potential with respect to the metal, then chemical inversion of the semiconductor depletion region occurs. This tends to further increase the metal boundary recombination velocity, to reduce the barrier height, to reduce the depletion layer width, and to increase the metal minority carrier injection ratio. A more extreme unipolar conversion process exists in that the metal unipolar flux is converted to a quasi-unipolar flux of the opposite polarity in the semiconductor. This requires a larger metal boundary recombination velocity in order to effect the flux conversion. The metal minority carrier injection ratio is greater than half due to flux polarity conversion. The barrier height for chemical inversion of the semiconductor is termed the anisotype Schottky barrier, which is always the case for the metal minority carrier injection ratio greater than half. The anisotype Schottky barrier height decreases with increasing chemical inversion since the divergence in chemostatic potential magnitudes decreases. The barrier height is strictly related to effective bandgap disparity between the two materials without regard to which band is primarily occupied with mobile carriers. Hence, materials of primarily equal unipolar charge transport, albeit with opposite polarity mobile carriers, will have a vanishing anisotype Schottky barrier height.

In addition to metal boundary recombination velocity considerations, an additional lattice boundary recombination velocity exists due to the termination of the periodic semiconductor region. The magnitude of the lattice boundary recombination velocity varies greatly dependent upon the method of termination and is heavily process dependent. Thermal oxidation, for instance, tends to reduce dangling covalent bonds with the proper anneals, and hence, reduces the lattice boundary recombination velocity. A heavily doped diffusion also reduces the lattice boundary recombination velocity since the minority carrier concentration is reduced, which reduces the recombination velocity since minority carrier capture is the rate limiting event in the recombination/generation process. The diffusion also reduces the isotype Schottky barrier height for the proper metal. The preferred situation is aluminum with an acceptor diffusion contacting acceptor doped silicon regions and titanium with a donor diffusion contacting donor doped silicon regions. The diffusion will also form a barrier with the semiconductor region. The diffusion is limited in effectiveness due to interstitial crystal damage due to the diffusion process as well as bandgap narrowing effects at higher doping levels. The lattice boundary recombination velocity is also affected by interfacial effects generated in wafer processing.

In semiconductor boundary regions not directly contacted, the boundary recombination velocity is simply the lattice boundary recombination velocity and can be enhanced by such techniques as surface diffusion or thermal oxidation. However, for non-planar, non-compensated semiconductor regions these techniques are not available and control of the lattice boundary recombination velocity is difficult. In regions where the semiconductor is contacted by a metal, the boundary recombination velocity is the sum of the lattice and metal boundary recombination velocities. It is possible to adjust the metal boundary recombination velocity so as to optimize the total boundary recombination potential. A wider metal-semiconductor depletion region with a higher isotype Schottky barrier height tends to reduce the lattice recombination velocity by reducing the minority carrier concentration, similar to the effect of a diffusion, in the vicinity of the lattice termination where the trap concentration is high. On the other hand, increasing the isotype Schottky barrier height increases the metal boundary recombination velocity. As always, nature offers a rate balancing opportunity between the metal and lattice recombination velocities in order to realize an optimum. An anisotype Schottky barrier is deleterious in that it provides a higher metal boundary recombination velocity while narrowing the metal-semiconductor depletion width so as to expose more termination traps, and correspondingly, to raise the lattice boundary recombination velocity. Consequently, an anisotype Schottky diode with moderate barrier height maximizes minority carrier injection in the semiconductor region. An example of this effect is an aluminum contact to lightly donor doped silicon regions which forms a rectifying junction with hole injection into the silicon.

In accordance with a preferred embodiment of the invention, a semimetal is used to effectively reduce and control the semiconductor boundary recombination velocity as well as controlling the metal minority carrier injection ratio. The semimetal is in the form of a thin, microcrystalline film. For monocrystalline silicon, the hole-gas semimetal is acceptor and oxygen doped microcrystalline silicon while the electron-gas metal is donor and oxygen doped microcrystalline silicon. Although many techniques can be employed to fabricate the semimetal, such as low pressure chemical vapor deposition and so forth, it is believed in that silicon-based molecular beam epitaxy (MBE) is particularly advantageous.

Thus, the monocrystalline silicon is epitaxially grown in an ultra high vacuum by molecular beam evaporation with concurrently low energy dopant implantation to accurately set the monocrystalline chemostatic potential. At the desired monocrystalline termination point, the dopant implantation dose is abruptly increased and low energy oxygen implantation commenced. The oxygen is thus implanted several atomic layers below the monocrystalline growth front so as not to disrupt the lattice periodicity. Therefore, the monocrystalline lattice is not abruptly terminated, but rather, is abruptly phased into the semimetal. This is accomplished without breaking the ultra high vacuum, for instance, about 10 to 12 torr, in which the structure is fabricated. Consequently, undesirable interfacial effects are avoided and the only perturbation to the interfacial covalent bonding is the required quantum mechanical transition from a semiconductor to a semimetal. This approach terminates the well ordered crystal with a slightly disordered microcrystalline film with minimum additional recombination velocity effects a as result of processing.

The semimetal itself, in the case of silicon, is doped silicon microcrystals with a thin, surrounding silicon oxide. Upon subsequent rapid thermal annealing, the oxygen atoms tend to segregate out since they are generally above the solid solubility of silicon. Since the Si-O bond is favored over the Si-Si bond, microcrystalline silicon grains are formed in a sea of essentially silicon dioxide with a surrounding Si-O bond that maximizes the granular surface area. Higher temperature annealing forms larger silicon grains with a thinner, denser, intergranular dielectric. Increased impurity doping concentration reduces the grain size and the inter-granular dielectric thickness. The larger number of traps in the inter-granular dielectric tend to deplete the small silicon grains, even at relatively high doping levels.

The chemostatic potential is essentially unchanged during mobile carrier transport, (due to the properties of a semimetal). The inter-granular barrier varies between about 2A and 10A, depending upon the oxygen concentration, impurity concentration, and annealing conditions. Conduction occurs by means of tunneling through the inter-granular oxide barrier with enhanced tunneling with increased impurity concentrations due to relatively thinner inter-granular dielectric. Since tunneling is primarily a majority carrier phenomenon, semimetals tend to transmit majority carriers but act like reflective quantum mechanical barriers to minority carriers. Increased oxygen concentration tends to raise the potential energy barrier while increased impurity concentration tends to lower the barrier for majority carriers. Thus, there exists an increasing discrimination between minority and majority carrier transport which can be viewed as an increased chemostatic potential magnitude.

The semimetal acts as a unipolar carrier transport system with chemostatic potentials beyond the extremes of the semiconductor conduction and valence bands. An acceptor doped semimetal will provide unipolar hole transport while a donor doped semimetal will provide unipolar electron transport. An acceptor doped semimetal contacting an acceptor doped semiconductor or a donor doped semimetal contacting a donor doped semiconductor are termed isotype semimetals while other combinations are termed anisotype semimetals. The semimetal unipolar transport characteristics and effective chemostatic potential can be controlled by varying the oxygen and impurity concentrations. The semimetal permits low impedance unipolar transport vertically due to tunneling through limited granular barriers while lateral transport is severely impeded due to significant number of grain barriers. Lateral gradient provides lateral field relief.

The semimetal need not be directly terminated in the ultra-high vacuum silicon-based MBE. For example, in particular applications, the oxygen and impurity ion implantation can be abruptly shuttered and several hundred angstroms of undoped, crystalline silicon grown. This film enhances the patterning of the semimetal as well as multiple deposition of semimetals. After crystalline deposition, a thin oxide may be deposited by low chemical vapor deposition techniques and densified by subsequent rapid thermal annealing. The silicon dioxide can easily be patterned by any number of known techniques, including, for instance direct selective patterning by ion beam lithography. The thin, undoped monocrystalline silicon can readily be anisotropically etched with the oxide aperture serving as the etch mask. There is virtually no undercutting and also excellent etch selectivity as the anisotropic etchant will rapidly etch the undoped silicon but will virtually not etch the semimetal.

Figure 2:
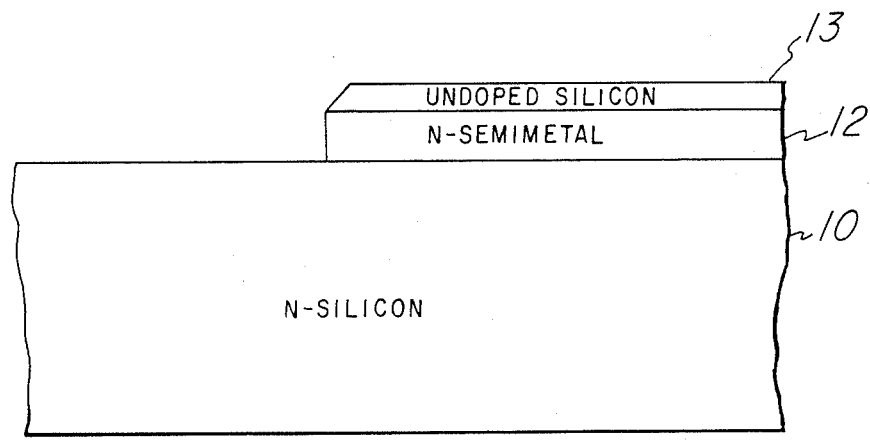
FIG. 2 is a side elevational cross-section of a semiconductor material on which an etched isotype donor semimetal in accordance with a preferred embodiment of the invention has been formed.

Thus, for example, as shown in FIG. 1, an n type semimetal layer 12 is formed on an n type substrate 10. A layer 13 of undoped monocrystalline silicon is formed on the semimetal layer 12, and a layer 14 of silicon dioxide is formed on the monocrystalline silicon layer 13. The semimetal layer 12 can be easily etched by plasma etching with a carbon tetrafluoride ambient with the patterned undoped monocrystalline silicon layer 13 serving as the etch mask which was etched with an anisotropic etchant, for example, potassium hydroxide, with the patterned oxide as an etch mask. Since the monocrystalline silicon layer 13 is virtually unaffected by the etching plasma, a structure results as is shown in FIG. 2.

Figure 3:
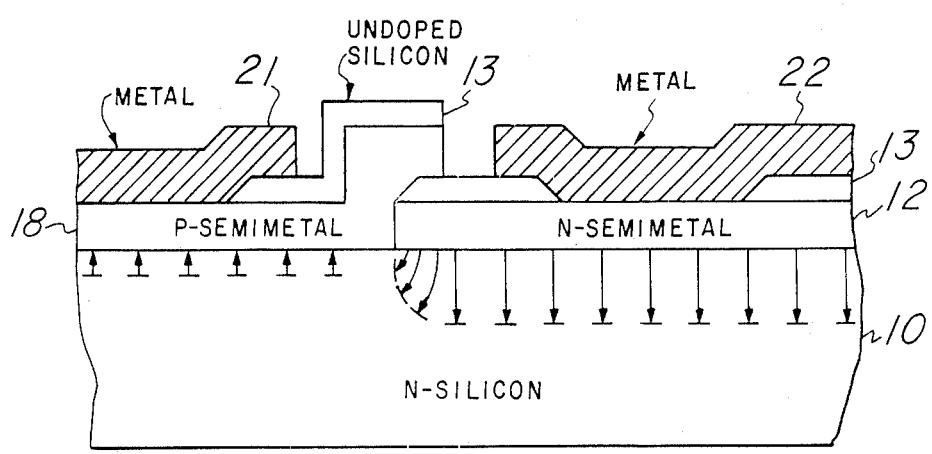
FIG. 3 is a side elevational cross-section of a semiconductor material illustrating patterned isotype and anisotype semimetals in accordance with a preferred embodiment of the invention have been formed.

As illustrated in FIG. 3, a second anisotype acceptor semimetal layer 18 can be deposited and etched in a similar manner. Contact vias are formed by selectively patterning the undoped silicon layers 13 to expose semimetal surfaces, and a metal is deposited and patterned to form contacts 21 and 22, as shown.

The metal-semimetal interface will not be transport limiting so long as virgin semimetal exits between the metal and the semiconductor. However, a series resistance in the semimetal between the metal and semiconductor may exist. Thus, the semimetal should be thick enough so as to totally control the effective chemostatic potential terminating the semiconductor crystal but not excessively thick so as to enhance the semimetal resistance in series with the metal. Consequently, the boundary recombination velocity of the monocrystalline semiconductor region is essentially set by the semimetal tunneling characteristics and effective chemostatic potential, which are set by the oxygen and impurity concentrations.

Thus, semimetal films with controllable chemostatic potential and transport resistance are used to control the semiconductor boundary recombination velocity and to transmit electrical current into and out of a crystalline semiconductor lattice. Isotype and anisotype semimetals with either unipolar hole or unipolar electron transport form isotype and anisotype Schottky barriers with variable barrier heights. This concept lends itself to three dimensional processing and permits accurate control of semiconductor neutral region boundaries to optimize semiconductor charge transport.

Although the invention has been described and illustrated with a certain degree of particularity, it is understood that the present disclosure has been made by way of example only and that numerous changes in the combination and arrangement of parts or steps may be resorted to by those skilled in the art without departing from the spirit and the scope of the invention as hereinafter claimed.

What is claimed is:

1. A method for forming a semiconductor contact system that provides electrical contact to a semiconductor region with control of the boundary recombination velocity in order to optimize semiconductor transport phenomena, comprising:
   epitaxially growing monocrystalline silicon in an ultra high vacuum by molecular beam evaporation onto a substrate;
   forming a thin, doped mirocrystalline film on the resulting substrate by molecular beam deposition, said film comprising a hole-gas semimetal of acceptor atoms and oxygen doped polycrystalline semiconductor material, and an electron-gas semimetal of donor atoms and oxygen doped polycrystalline semiconductor material;
   said thin film being formed by concurrently conducting a low energy dopant implantation to set the chemostatic potential of the substrate, and increasing the dopant implantation dose and commencing low energy oxygen implantation at a desired monocrystalline termination point, to implant oxygen several atomic layers below the monocrystalline growth front to preserve the lattice periodicity of the substrate, whereby the monocrystalline lattice phases into the semimetal.

2. The method of claim 1 further comprising:
   shuttering the dopant and low energy oxygen implantation at a desired monocrystalline termination point,
   and growing a layer of undoped crystalline silicon over the oxygen implanted silicon.

3. The method of claim 2 further comprising depositing a thin oxide by low pressure chemical vapor deposition techniques and densifying the oxide by rapid thermal annealing.

4. The method of claim 3 further comprising patterning the oxide.

5. The method of claim 4 wherein said patterning comprises direct selective ion beam lithography.

* * * * *